United States Patent [19]
Tsai et al.

[11] Patent Number: 6,130,433
[45] Date of Patent: Oct. 10, 2000

[54] ION SOURCE CHAMBER OF A HIGH ENERGY IMPLANTER WITH A FILTERING DEVICE

[75] Inventors: Pei-Wei Tsai; Hua-Jen Tseng, both of Hsin-Chu Hsien; Dong-Tay Tsai, Kaohsiung; Chih-Hsien Chang, Taipei Hsien, all of Taiwan

[73] Assignee: Mosel Vitelic Inc., Hsin-Chu, Taiwan

[21] Appl. No.: 09/303,598

[22] Filed: May 3, 1999

[30] Foreign Application Priority Data

Jan. 19, 1999 [TW] Taiwan ................................ 88100739

[51] Int. Cl.$^7$ ...................................................... H01J 37/00
[52] U.S. Cl. ......................................................... 250/423 R
[58] Field of Search ........................... 250/423 R, 492.21, 250/431

[56] References Cited

U.S. PATENT DOCUMENTS 5,438,205  8/1995  Schroeder ........................... 250/423 R

*Primary Examiner*—Kiet T. Nguyen
*Attorney, Agent, or Firm*—Winston Hsu

[57] ABSTRACT

The present invention relates to an ion source chamber of a high energy implanter. The ion source chamber comprises a main chamber for generating ions for ion implantation, a vent-pipe having two open ends, one end of the vent-pipe being connected to the main chamber for releasing air from the main chamber, a releasing valve connected to another end of the vent-pipe for releasing the air in the main chamber when the pressure of the air in the main chamber exceeds a predetermined pressure, and a filtering device installed between the vent-pipe and the releasing valve for filtering impurities contained in the air carried by the vent-pipe so as to prevent the impurities from falling into the releasing valve.

6 Claims, 3 Drawing Sheets

ION SOURCE CHAMBER OF A HIGH ENERGY IMPLANTER WITH A FILTERING DEVICE

BACKGROUND OF THE INVENTION

1. Field of the Invention

The present invention relates to a high energy implanter, and more particularly, to an ion source chamber of a high energy implanter with a filtering device.

2. Description of the Prior Art

Doping is a critical step in a semiconductor process. It can be performed by using either diffusion or ion implantation. Ion implantation has proven to be the superior technique as it can produce an improved dopant profile. Also with ion implantation, it is possible to adjust dopant concentration. For these reasons, ion implantation has become the technique of choice for doping in the semiconductor process.

Ions are generated by an ion source chamber of a high energy implanter. These ions are then implanted into a semiconductor wafer. Operations of the ion source chamber are performed by having electrons bombard gaseous molecules causing them to ionize. The ionized molecules are then accelerated through an electric field to strike the semiconductor wafer where they become implanted. This process is carried out at a low pressure as this is necessary to maintain electric current.

Please refer to FIG. 1. FIG. 1 is a perspective view of a prior art ion source chamber 10. The ion source chamber 10 comprises a main chamber 12 for generating ions for ion implantation, a vent-pipe 13 and a releasing valve 14. The vent-pipe 13 has two open ends: One end is connected to the main chamber 12 and the other end is connected to the releasing valve 14. Air is released through the end of the vent-pipe 13 connected to the main chamber 12. There is also an O-ring tightly clamped between the vent-pipe 13 and the releasing valve 14 for preventing air leakage. The vent-pipe 13 and the releasing valve 14 are necessary for maintaining the pressure in the main chamber 12. The high energy implanter is a vacuum system, therefore, some form of gas must be supplied (e.g. air or nitrogen) to restore the pressure in the main chamber to 1 atm before maintenance. If it is the case, the turbo pump is first stopped, then nitrogen is introduced into the main chamber 12 to increase the pressure. When the pressure exceeds 1 atm, the releasing valve 14 opens and the excess gas is released through the exhaust pipe 16.

During venting of the ion source chamber 10, impurities produced from ions or those shed from the inner wall of the main chamber 12 may become mixed with the nitrogen as it is introduced. Since the releasing valve 14 is located on the underside of the main chamber 12, it is easy for these impurities to drop into the O-ring between the vent-pipe 13 and the releasing valve 14. The impurities thus accumulate and hamper the connection of the vent-pipe 13 with the releasing valve 14. The result is the vent-pipe 13 and releasing valve 14 can no longer form a tight seal with each other not only causing gas leakage to occur but also preventing the high energy implanter from achieving a vacuum. Therefore, periodic cleaning must be performed on the releasing valve 14 which necessitates stopping the turbo pump and removing the releasing valve 14. As it takes a long time to power down or power up the turbo pump, it can be clearly seen that much time and money is wasted cleaning the releasing valve 14.

SUMMARY OF THE INVENTION

It is therefore a primary objective of the present invention to provide an ion source chamber of a high energy implanter to solve the above mentioned problem.

In a preferred embodiment, the present invention relates to an ion source chamber of a high energy implanter comprising:

a main chamber for generating ions for ion implantation;

a vent-pipe having two open ends, one end of the vent-pipe being connected to the main chamber for releasing air from the main chamber;

a releasing valve connected to another end of the vent-pipe for releasing the air in the main chamber when the pressure of the air in the main chamber exceeds a predetermined pressure; and a filtering device installed between the vent-pipe and the releasing valve for filtering impurities contained in the air carried by the vent-pipe so as to prevent the impurities from falling into the releasing valve.

It is an advantage of the present invention that the filtering device installed between the vent-pipe and the releasing valve can filter impurities contained in the air carried by the vent-pipe so that these particles will not fall into the releasing valve to hamper the connection of the vent-pipe with the releasing valve.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Figure 1:
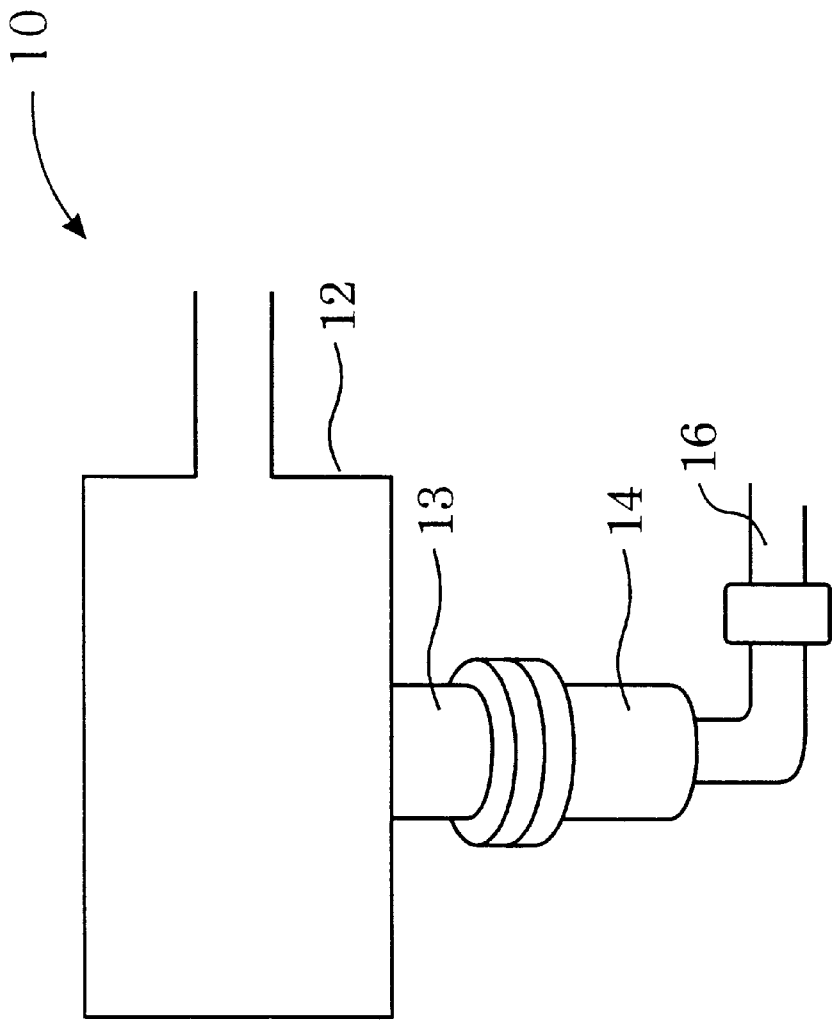
FIG. 1 is a perspective view of a prior art ion source chamber.
Figure 2:
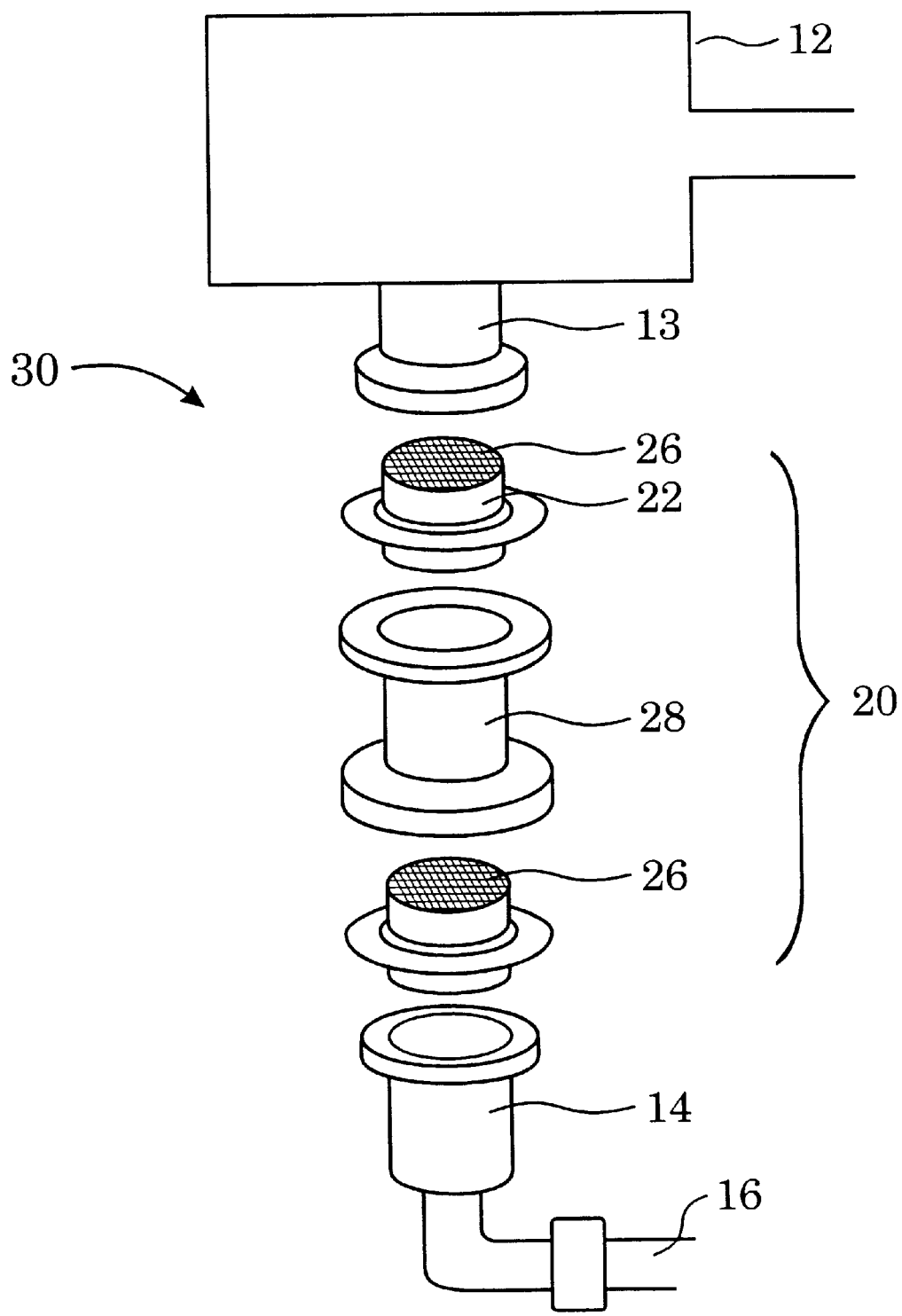
FIG. 2 is a component diagram of an ion source chamber according to the present invention.
Figure 4:
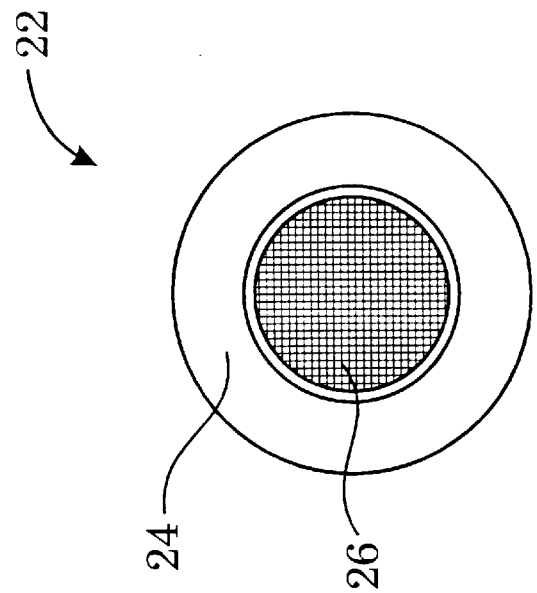
FIG. 4 is a top view of the round link shown in FIG. 2.
Figure 3:
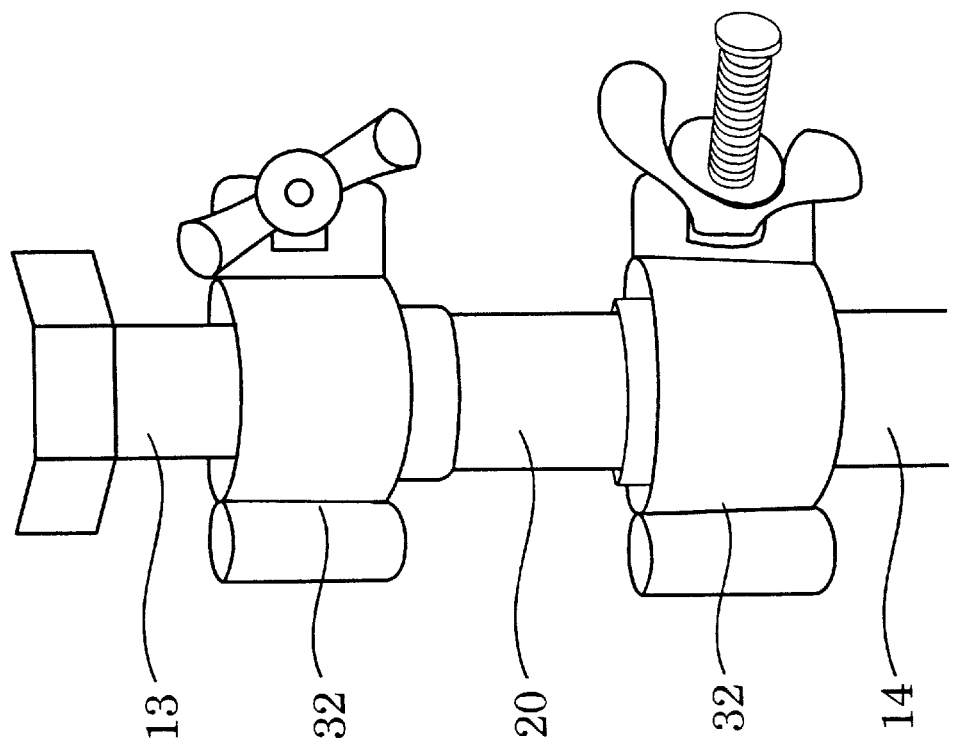
FIG. 3 is a perspective view of the ion source chamber in FIG. 2.

Please refer to FIG. 2 to FIG. 4. FIG. 2 is a component diagram of an ion source chamber 30 according to the present invention. FIG. 3 is a perspective view of the ion source chamber 30 shown in FIG. 2. FIG. 4 is a top view of the round link 22 shown in FIG. 2. The present invention relates to an ion source chamber 30 of a high energy implanter. The ion source chamber 30 comprises a main chamber 12 where ions are generated, a vent-pipe 13, a releasing valve 14, and a filtering device 20 installed between the vent-pipe 13 and the releasing valve 14. The vent-pipe 13 has two open ends, one connected to the main chamber 12 and one connected to the filtering device 20 which is in turn connected to the releasing valve 14. When the pressure within the main chamber 12 exceeds a predetermined value, air is released to pass sequentially through the vent-pipe 13, filtering device 20 and releasing valve 14. The vented air from the main chamber 12 contains impurities that are either sloughed off from the inner wall of the main chamber 12 or generated by the ions. These impurities are filtered from the air as it passes through the filtering device 20. In this way, the impurities do not fall into the releasing valve. There are also two fixing devices 32 that hold the vent-pipe 13, filtering device 20 and releasing valve 14 in place.

The filtering device 20 comprises a circular connecting pipe 28 and two round links 22. One of the round links 22 is installed between the circular connecting pipe 28 and the vent-pipe 13 and the other between the circular connecting pipe 28 and the releasing valve 14. As shown in FIG. 4, each of the round links 22 comprises a circular filtering mesh 26 and an O-ring 24 installed around the filtering mesh 26. The O-rings 24 provide an airtight seal between the circular connecting pipe 28 and both the vent-pipe 13 and releasing valve 14 thus preventing leakage of air. As stated above, particles in the vented air that are either sloughed from the inner coating of the main chamber 12 or generated by the ions are effectively filtered from the air by the filtering mesh 26 before the air passes through the releasing valve 14.

In contrast to the prior art, the ion source chamber 30 according to the present invention has a filtering device 20 which filters impurities from air released from the main chamber 12 before the air reaches the releasing valve 14. As the impurities are filtered from the air, they will not collect in the releasing valve 14. In this way, the airtight seal involving the releasing valve 14 is maintained, functioning of the releasing valve 14 is optimized and maintenance time of the device is reduced.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An ion source chamber of a high energy implanter comprising:

a main chamber for generating ions for ion implantation;

a vent-pipe having two open ends, one end of the vent-pipe being connected to the main chamber for releasing air from the main chamber;

a releasing valve connected to another end of the vent-pipe for releasing the air in the main chamber when the pressure of the air in the main chamber exceeds a predetermined pressure; and a filtering device installed between the vent-pipe and the releasing valve for filtering impurities contained in the air carried by the vent-pipe so as to prevent the impurities from falling into the releasing valve.

2. The ion source chamber of claim 1 wherein the vent-pipe is connected to a bottom side of the main chamber.

3. The ion source chamber of claim 1 wherein the impurities contained in the air carried through the vent-pipe are particles fallen from a coating on an inner side of the main chamber or particles generated by the ions.

4. The ion source chamber of claim 1 wherein the filtering device comprises at least one circular filtering mash for filtering the impurities contained in the air carried by the vent-pipe.

5. The ion source chamber of claim 4 wherein the filtering device comprises an O-ring connected around the filtering mash and the O-ring is tightly clamped between the vent-pipe and the releasing valve for preventing air leakage.

6. The ion source chamber of claim 5 wherein the filtering device comprises a circular connecting pipe and two circular filtering mashes wherein one filtering mash is installed between the circular connecting pipe and the vent-pipe and another filtering mash is installed between the circular connecting pipe and the releasing valve for filtering the impurities contained in the air carried by the vent-pipe.

* * * * *